United States Patent                 (10) Patent No.:     US 8,138,456 B2
Fukuda et al.                             (45) Date of Patent:        Mar. 20, 2012

(54) HEAT PROCESSING METHOD, COMPUTER-READABLE STORAGE MEDIUM, AND HEAT PROCESSING APPARATUS

(75) Inventors: Yoshiteru Fukuda, Koshi (JP); Kenichi Shigetomi, Koshi (JP); Shouken Moro, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 1359 days.

(21) Appl. No.: 11/742,319

(22) Filed: Apr. 30, 2007

(65) Prior Publication Data

US 2007/0257085 A1     Nov. 8, 2007

(30) Foreign Application Priority Data

May 8, 2006   (JP) .................................. 2006-129089

(51) Int. Cl.
*B23K 10/00* (2006.01)
*H05B 1/02* (2006.01)

(52) U.S. Cl. .................... 219/497; 219/121.58; 118/725; 156/345.52; 269/21

(58) Field of Classification Search ............... 219/121.4, 219/121.41, 121.44, 121.43, 121.58; 118/724, 118/728; 156/345.51, 345.52; 269/21
See application file for complete search history.

(56) References Cited

U.S. PATENT DOCUMENTS 5,191,218 A * 3/1993 Mori et al. ............... 250/453.11
5,707,051 A * 1/1998 Tsuji ............................. 269/21
7,078,262 B2 * 7/2006 Yamamoto et al. ........... 438/106
7,096,911 B2 * 8/2006 Hashizume et al. .......... 156/358
2006/0126050 A1 * 6/2006 Momose ......................... 355/72

FOREIGN PATENT DOCUMENTS

| JP | 2-290013   | 11/1990 |
| JP | 10-284360  | 10/1998 |
| JP | 11-214486  | 8/1999  |
| JP | 2006-173344 | 6/2006 |

OTHER PUBLICATIONS

Office Action issued Jan. 4, 2011 in Japanese Patent Application No. 2006-129089 (with English translation).

* cited by examiner

*Primary Examiner* — Mark Paschall
(74) *Attorney, Agent, or Firm* — Oblon, Spivak, McClelland, Maier & Neustadt, L.L.P.

(57) ABSTRACT

In the present invention, a plurality of suction ports are provided in a heating plate of a heat processing apparatus. The suction ports are provided at a central portion, an intermediate portion, and a peripheral portion of a substrate mounting surface of the heating plate, respectively. The warped state of the substrate before heat-processed is measured, so that when the substrate warps protruding downward, the suction start timing via a suction port corresponding to the outer peripheral portion of the substrate is set to be relatively early as compared to the suction start timings via the other suction ports, and when the substrate warps protruding upward, the suction start timing via the suction port corresponding to the central portion of the substrate is set to be relatively early as compared to the suction start timings via the other suction ports. This allows a portion of the substrate bending upward to be sucked first when the substrate is mounted on the heating plate, thereby quickly performing correction of the warpage of the substrate to uniformly heat the substrate.

19 Claims, 13 Drawing Sheets

HEAT PROCESSING METHOD, COMPUTER-READABLE STORAGE MEDIUM, AND HEAT PROCESSING APPARATUS

BACKGROUND OF THE INVENTION

1. Field of the Invention

The present invention relates to a substrate heat processing method, a computer-readable storage medium storing a program for embodying the heat processing method, and a heat processing apparatus.

2. Description of the Related Art

In a photolithography process in a manufacturing process of, for example, a semiconductor device, for example, a resist coating treatment for applying a resist solution onto a wafer to form a resist film, exposure processing for exposing the resist film into a predetermined pattern, heat processing for accelerating the chemical reaction in the resist film after exposure (post-exposure baking), and developing treatment for developing the exposed resist film are performed in sequence to form a predetermined resist pattern on the wafer.

The heat processing such as the above-described post-exposure baking is usually performed in a heat processing apparatus. The heat processing apparatus includes a heating plate having a heater attached thereto, and performs heat processing by mounting a wafer on the heating plate adjusted to a predetermined temperature in advance (Japanese Patent Application Laid-open No. H2-290013).

SUMMARY OF THE INVENTION

However, some wafers which will be subjected to the above-described heat processing have, for example, warpage protruding upward or protruding downward due to pre-processing or the like. When the wafer with warpage is mounted on the heating plate, the distance between the wafer and the heating plate varies within the wafer to fail to uniformly conduct heat from the heating plate to the wafer. The amount of accumulated heat of the wafer during the heat processing greatly affects the line width of the resist pattern to be finally formed on the wafer, and therefore if the heat does not conduct uniformly within the wafer as described above, the uniformity in line width of the resist pattern decreases.

The present invention has been developed in consideration of the above point, and its object is to heat-processing a substrate uniformly within the substrate when mounting and heat-processing the substrate with deformation such as warpage on a heat processing plate such as a heating plate.

The present invention to achieve the above object is a heat processing method of mounting and heat-processing a substrate on a heat processing plate, including the steps of: setting suction start timings via a plurality of suction ports in a substrate mounting surface of the heat processing plate, based on a deformed state of the substrate to be heat-processed; when mounting the substrate onto the heat processing plate, sucking the substrate via the suction ports based on the set suction start timings to attract the substrate onto the heat processing plate; and heat-processing the substrate on the heat processing plate. In the step of setting suction start timings, the suction start timing via a suction port corresponding to a portion of the substrate deformed upward is set to be earlier than the suction start timing via another suction port.

According to the present invention, when the substrate is mounted on the heat processing plate, the substrate can be corrected to be flat via a plurality of suction ports in the heat processing plate. Further, since the suction start timing via a suction port corresponding to a portion of the substrate deformed upward is set to be earlier than the suction start timing via another suction port corresponding to another portion of the substrate, the suction for a portion of the substrate apart from the heat processing plate is started first so that the correction of that portion is started earlier. As a result of this, the correction of the warpage of the substrate is performed quickly to reduce variations in start timing of the heat processing within the substrate to uniformly heat-process the substrate.

Such a heat processing method can be embodied as a program for causing a computer to execute control when implementing a heat processing method by mounting a substrate on a heat processing plate of a heat processing apparatus, and can be stored in a computer-readable storage medium.

According to another aspect, the present invention is a substrate heat processing apparatus, including: a heat processing plate for mounting and heat-processing a substrate thereon; a plurality of suction ports formed in a substrate mounting surface of the heat processing plate for sucking the substrate; and a control unit for setting suction start timings via the suction ports based on a deformed state of the substrate to be heat-processed to create time difference therebetween and, when mounting the substrate on the heat processing plate, for allowing the substrate to be sucked via the suction ports in sequence based on the set suction start timings to attract the substrate onto the heat processing plate.

According to the present invention, a deformed substrate can be uniformly heat-processed, so that products with uniform quality can be finally manufactured within the substrate, resulting in increased yields.

DETAILED DESCRIPTION OF THE INVENTION

Figure 1:
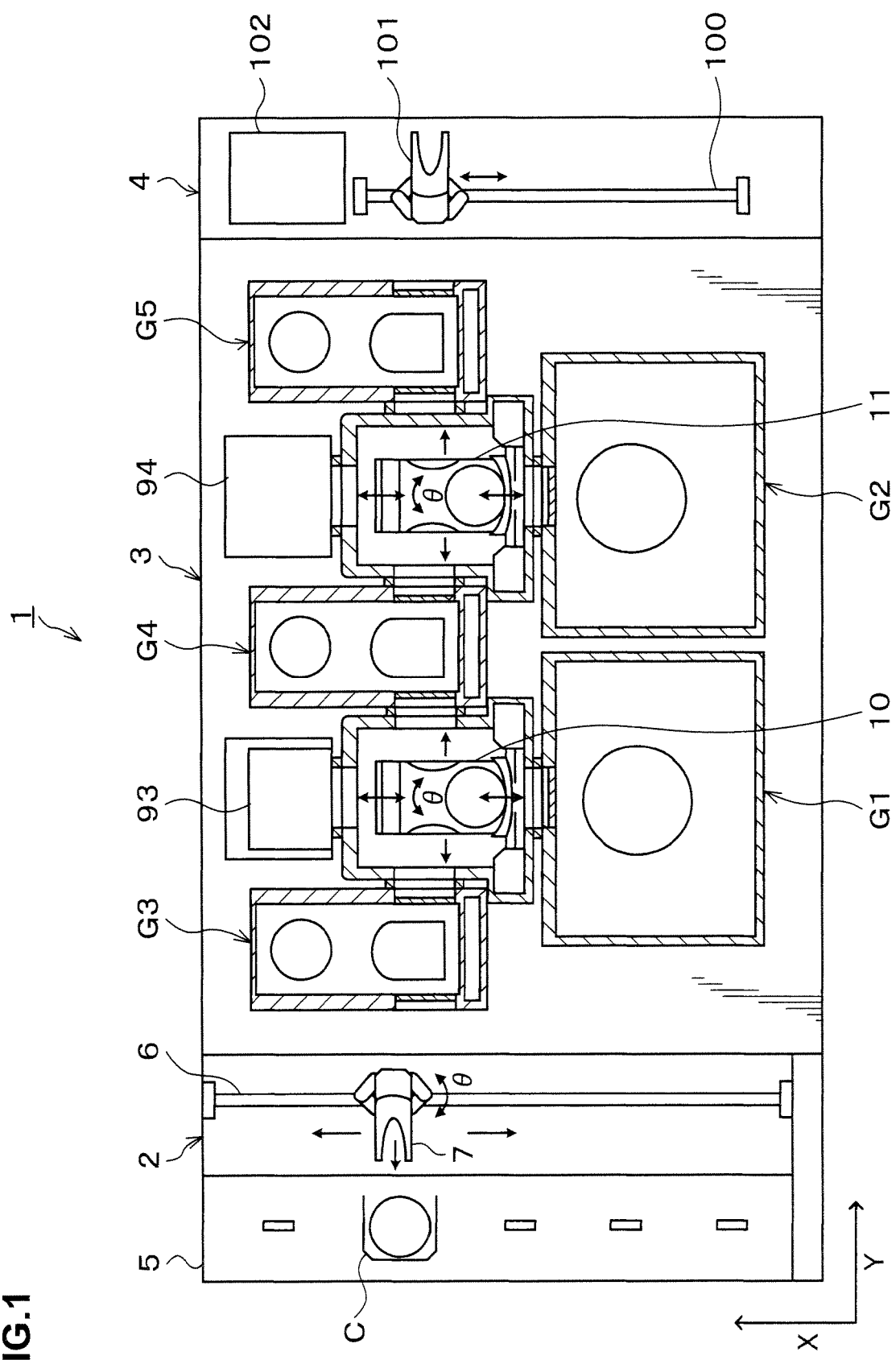
FIG. 1 is a plan view showing the outline of a configuration of a coating and developing treatment system.
Figure 2:
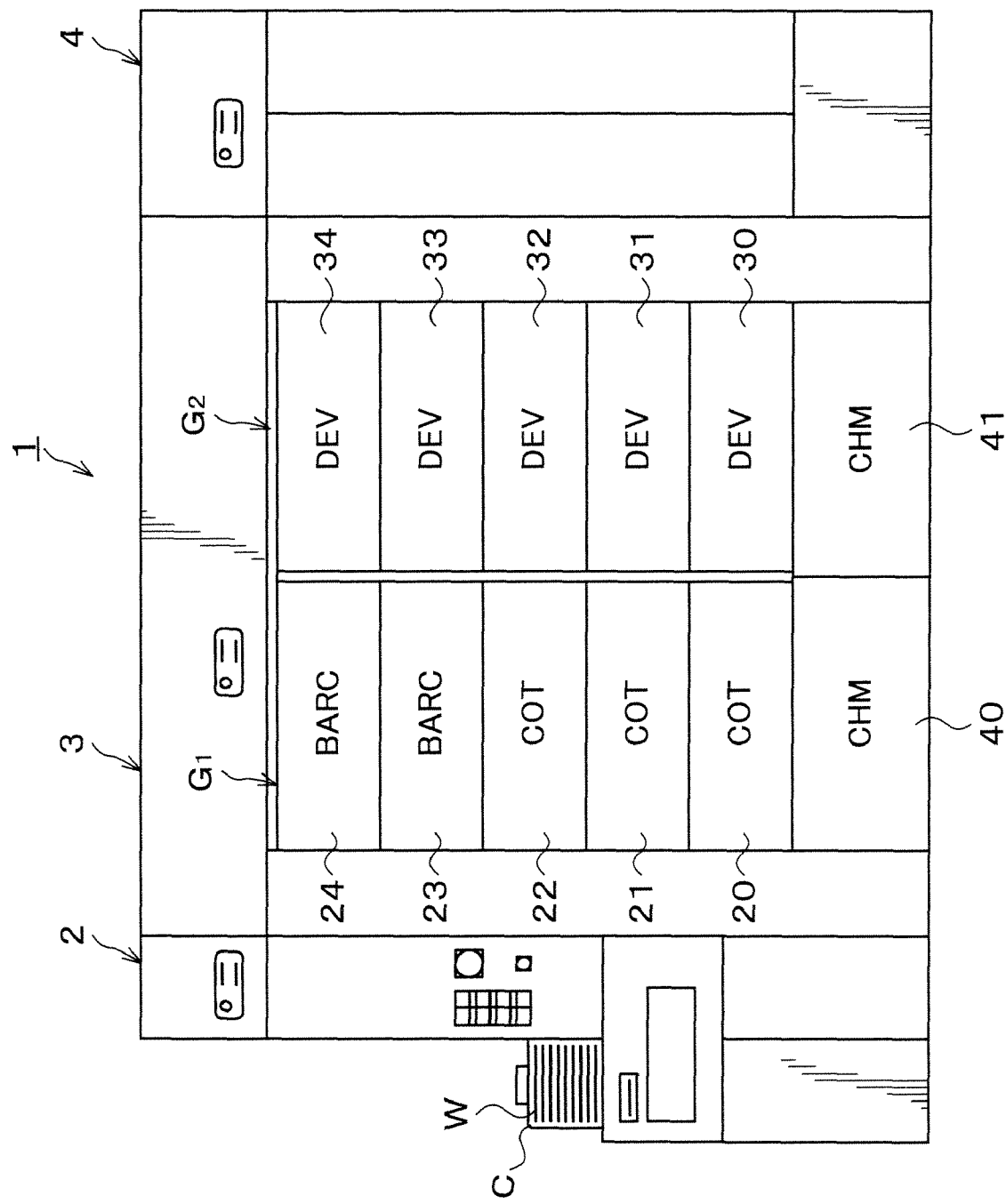
FIG. 2 is a front view of the coating and developing treatment system in FIG. 1.
Figure 3:
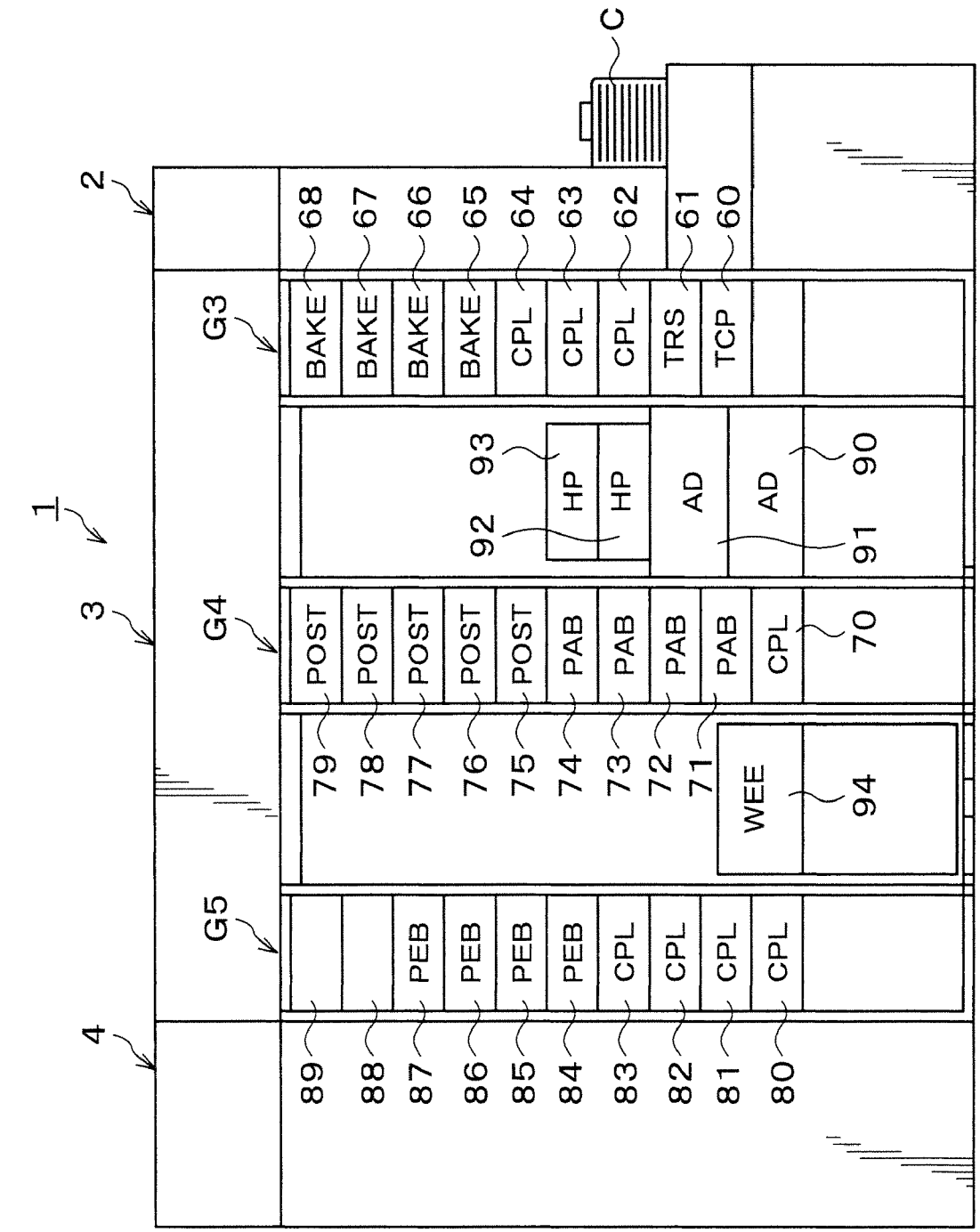
FIG. 3 is a rear view of the coating and developing treatment system in FIG. 1.

Hereinafter, a preferred embodiment of the present invention will be described. FIG. 1 is a plan view showing the outline of a configuration of a coating and developing treatment system 1 incorporating a heat processing apparatus according to the embodiment, FIG. 2 is a front view of the coating and developing treatment system 1, and FIG. 3 is a rear view of the coating and developing treatment system 1.

The coating and developing treatment system 1 has, as shown in FIG. 1, a configuration in which, for example, a cassette station 2 for transferring, for example, 25 wafers W per cassette as a unit from/to the outside into/from the coating and developing treatment system 1 and transferring the wafers W into/out of a cassette C; a processing station 3 including a plurality of various kinds of processing and treatment units, which are multi-tiered, for performing predetermined processing or treatment in a manner of single wafer processing in the photolithography process; and an interface section 4 for delivering the wafers W to/from a not-shown aligner provided adjacent to the processing station 3, are integrally connected together.

In the cassette station 2, a cassette mounting table 5 is provided and configured such that a plurality of cassettes C can be mounted thereon in a line in an X-direction (a top-to-bottom direction in FIG. 1). In the cassette station 2, a wafer transfer body 7 is provided which is movable in the X-direction on a transfer path 6. The wafer transfer body 7 is also movable in a wafer-arrangement direction of the wafers W housed in the cassette C (a Z-direction; the vertical direction), and thus can selectively access the wafers W in each of the cassettes C arranged in the X-direction.

The wafer transfer body 7, which is rotatable in a θ-direction around the Z-axis, can access a temperature regulating unit 60 and a transition unit 61 included in a later-described third processing unit group G3 on the processing station 3 side.

The processing station 3 adjacent to the cassette station 2 includes, for example, five processing unit groups G1 to G5 in each of which a plurality of processing and treatment units are multi-tiered. On the side of the negative direction in the X-direction (the downward direction in FIG. 1) in the processing station 3, the first processing unit group G1 and the second processing unit group G2 are placed in order from the cassette station 2 side. On the side of the positive direction in the X-direction (the upward direction in FIG. 1) in the processing station 3, the third processing unit group G3, the fourth processing unit group G4, and the fifth processing unit group G5 are placed in order from the cassette station 2 side. Between the third processing unit group G3 and the fourth processing unit group G4, a first transfer unit 10 is provided.

The first transfer unit 10 can selectively access the processing and treatment units in the first processing unit group G1, the third processing unit group G3, and the fourth processing unit group G4 and transfer the wafer W to them. Between the fourth processing unit group G4 and the fifth processing unit group G5, a second transfer unit 11 is provided. The second transfer unit 11 can selectively access the processing and treatment units in the second processing unit group G2, the fourth processing unit group G4, and the fifth processing unit group G5 and transfer the wafer W to them.

In the first processing unit group G1, as shown in FIG. 2, solution treatment units each for supplying a predetermined liquid to the wafer W to perform treatment, for example, resist coating units 20, 21, and 22 each for applying a resist solution to the wafer W, and bottom coating units 23 and 24 each for forming an anti-reflection film that prevents reflection of light at the time of exposure processing, are five-tiered in order from the bottom. In the second processing unit group G2, solution treatment units, for example, developing treatment units 30 to 34 each for supplying a developing solution to the wafer W to develop it are five-tiered in order from the bottom. Further, chemical chambers 40 and 41 each for supplying various kinds of treatment solutions to the solution treatment units in the processing unit groups G1 and G2 are provided at the lowermost tiers of the first processing unit group G1 and the second processing unit group G2, respectively.

As shown in FIG. 3, in the third processing unit group G3, for example, the temperature regulating unit 60, the transition unit 61 for passing the wafer W, high-precision temperature regulating units 62 to 64 each for temperature-regulating the wafer W under temperature control with a high precision, and high-temperature heat processing units 65 to 68 each for heat-processing the wafer W at a high temperature, are nine-tiered in order from the bottom.

In the fourth processing unit group G4, for example, a high-precision temperature regulating unit 70, pre-baking units 71 to 74 each for heat-processing the wafer W after resist coating treatment, and post-baking units 75 to 79 each for heat-processing the wafer W after developing treatment, are ten-tiered in order from the bottom.

In the fifth processing unit group G5, for example, high-precision temperature regulating units 80 to 83, post-exposure baking units (hereinafter, referred to as "PEB units") 84 to 87 each as a heat processing apparatus according to the present invention, and warpage measuring units 88 and 89 each for measuring warpage of the wafer, are ten-tiered in order from the bottom.

On the rear side of the first transfer unit 10 the third processing unit group G3 as shown in FIG. 1, a plurality of processing and treatment units are arranged, for example, adhesion units 90 and 91 each for performing hydrophobic treatment on the wafer W and heating units 92 and 93 each for heating the wafer W being four-tiered in order from the bottom as shown in FIG. 3. As shown in FIG. 1, on the rear side of the second transfer unit 11, for example, an edge exposure unit 94 is disposed which selectively exposes only the edge portion of the wafer W to light.

In the interface section 4, for example, a wafer transfer body 101 moving on a transfer path 100 extending in the X-direction and a buffer cassette 102 are provided as shown in FIG. 1. The wafer transfer body 101 is movable in the Z-direction and also rotatable in the O-direction and thus can access the not-shown aligner adjacent to the interface section 4, the buffer cassette 102, and the fifth processing unit group G5 and transfer the wafer W to them.

Figure 4:
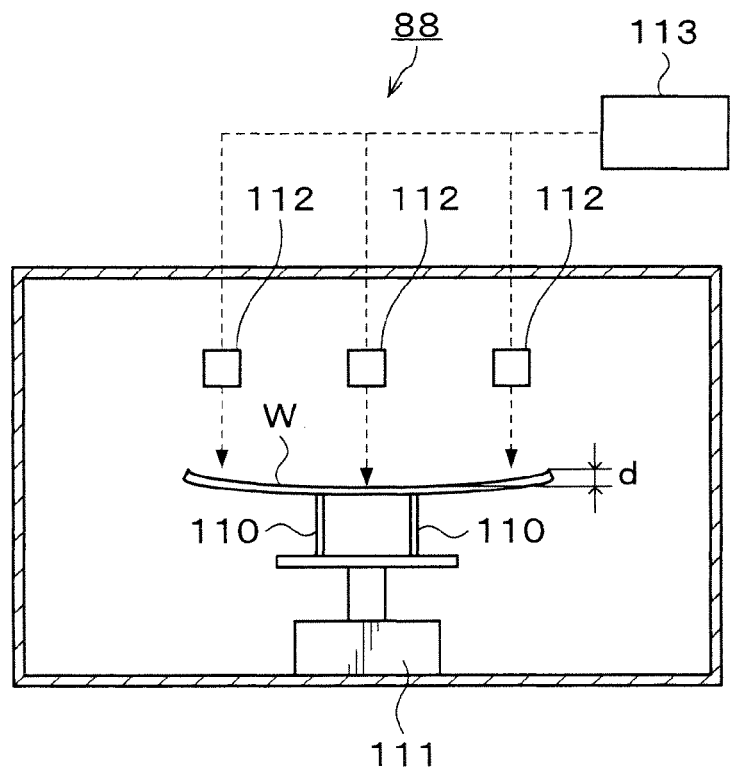
FIG. 4 is an explanatory view of a longitudinal section showing the outline of a configuration of a warpage measuring unit.
Figure 5:
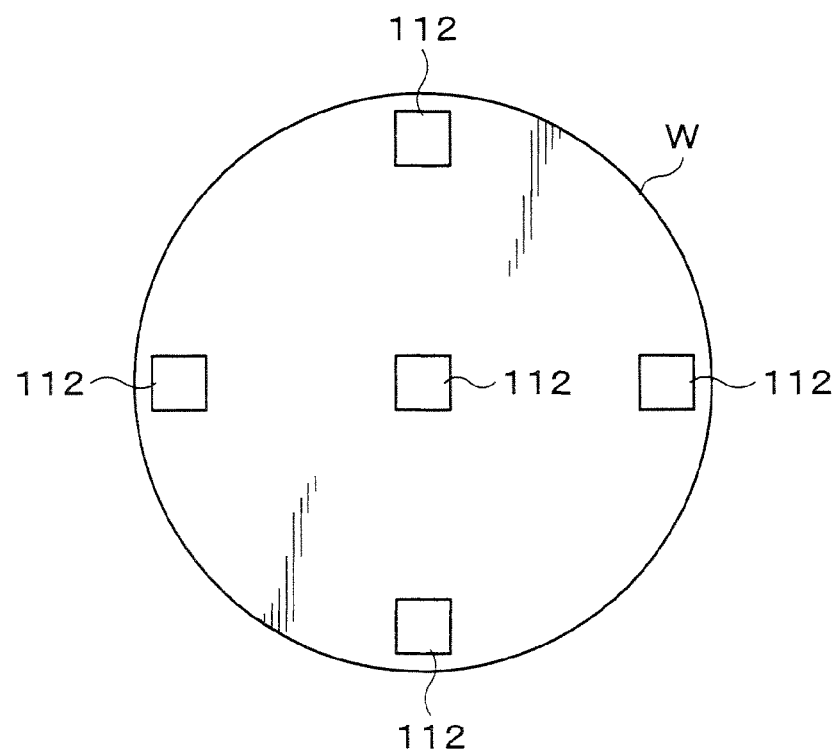
FIG. 5 is a plan view of a wafer in the warpage measuring unit showing the arrangement of laser displacement gauges.

Next, the configuration of the aforementioned warpage measuring units 88 and 89 will be described. The warpage measuring unit 88, for example, comprises a plurality of support pins 110 for supporting the wafer W in a horizontal position as shown in FIG. 4. The support pins 110 are configured to freely rise and lower by means of a drive mechanism 111 including, for example, a cylinder. Above the wafer W supported on the support pins 111, for example, a laser displacement gauge 112 is provided which is a warpage measuring member. The laser displacement gauge 112 can measure the distance to the front surface of the wafer W. A plurality of laser displacement gauges 112 are provided, for example, above the wafer W supported on the support pins 110 such that they are provided above the central portion of the wafer W and above the outer peripheral portion of the wafer W. For example, four laser displacement gauges 112 are provided above the outer peripheral portion of the wafer W at regular intervals on the same circumference as shown in FIG. 5.

The measurement information by each of the laser displacement gauge 112 is outputted, for example, to a measurement control unit 113, so that based on the measurement information, the measurement control unit 113 can calculate, for example, a level difference d between the central portion and the outer peripheral portion of the wafer W to measure the warped state of the wafer W, such as the warpage amount and the warped shape of the wafer W. Note that the warpage amount of the wafer W can be calculated from the level difference d between the central portion and the outer peripheral portion of the wafer W. Besides, the warped shape results from the level difference d such that the wafer W is curved protruding downward, when the outer peripheral portion of the wafer W is higher than the central portion, and the wafer W is curved protruding upward when the central portion of the wafer W is higher than the outer peripheral portion. The measurement information on the warped state of the wafer W in the measurement control unit 113 can be outputted to a later-described control unit 153 of the PEB units 84 to 87.

The warpage measuring unit 89 has the same configuration as that of the warpage measuring unit 88, and therefore its description will be omitted.

Figure 6:
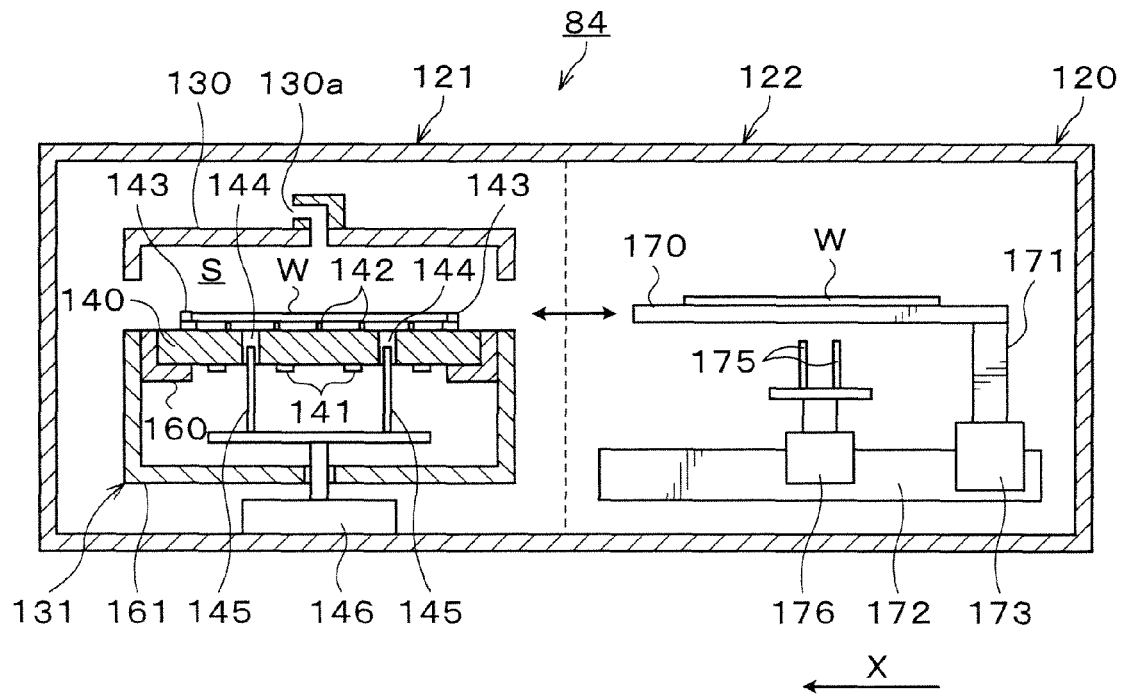
FIG. 6 is an explanatory view of a longitudinal section showing the outline of a configuration of a PEB unit.
Figure 7:
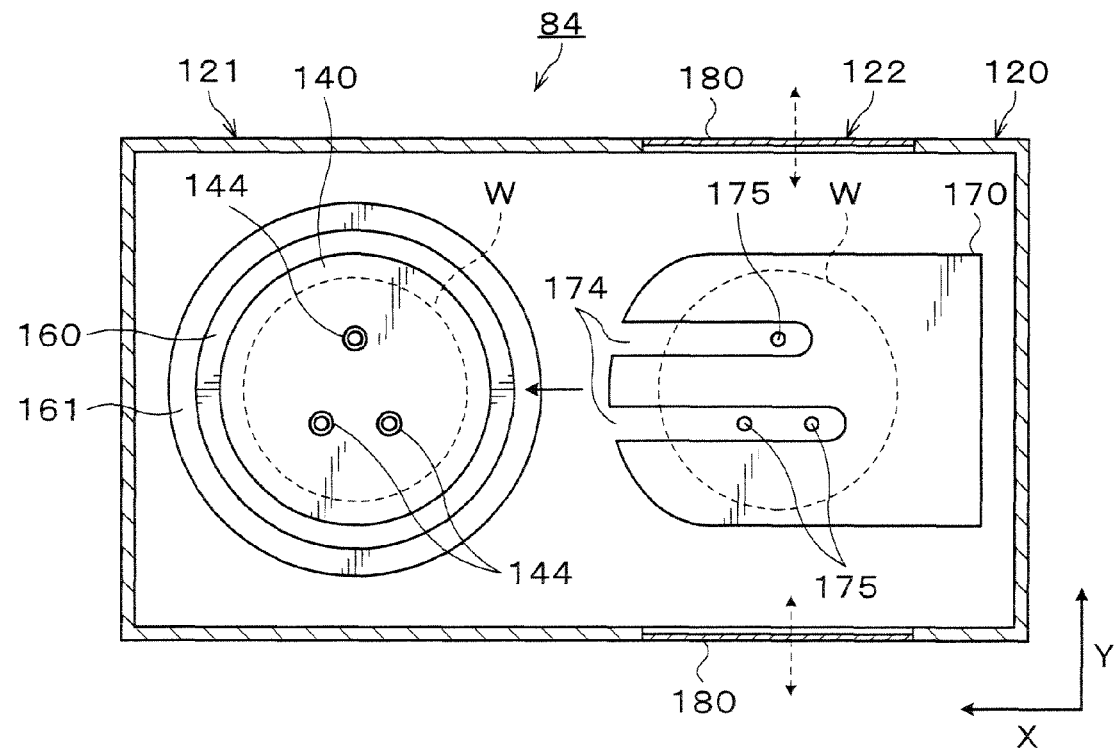
FIG. 7 is a an explanatory view of a transverse section showing the outline of a configuration of the PEB unit.

Next, the configuration of the aforementioned PEB units 84 and 87 will be described. As shown in FIG. 6 and FIG. 7, the PEB unit 84, for example, comprises a heating section 121 for heating the wafer W and a cooling section 122 for cooling the wafer W in a housing 120.

The heating section 121 has, as shown in FIG. 6, a lid body 130 that is located on the upper side and vertically movable, and a heating plate accommodating unit 131 that is located on the lower side and forms a processing chamber S together with the lid body 130.

The lid body 130 has an almost cylindrical shape with a lower face open. The central portion of the upper surface of the lid body 130 is provided with an exhaust portion 130*a*. The atmosphere in the processing chamber S is uniformly exhausted through the exhaust portion 130*a*.

At the center of the heating plate accommodating unit 131, a heating plate 140 is provided as a heat processing plate for mounting and heating the wafer W thereon. The heating plate 140 has a substantial disk shape with a large thickness.

To the lower surface of the heating plate 140, heaters 141 are attached which generate heat by power feeding. The heat generation of the heaters 141 can adjust the heating plate 140 to a predetermined set temperature.

A plurality of gap pins 142 for supporting the wafer W are provided on a wafer mounting surface 140*a* being the upper surface of the heating plate 140. The gap pins 142 form a small gap between the wafer W and the heating plate 140 to allow the wafer W to be heated by radiation heat from the heating plate 140 without contact. At outer edge portion of the wafer mounting surface 140*a* of the heating plate 140, guide pins 143 are provided which support the outer side surface of the wafer W. The guide pins 143 can guide the wafer W onto the gap pins 142 to prevent displacement of the wafer W.

The heating plate 140 is formed with a plurality of through holes 144 vertically passing through the heating plate 140. In the through holes 144, first raising and lowering pins 145 are provided. The first raising and lowering pins 145 can rise and lower by means of a raising and lowering drive mechanism 146 such as a cylinder. The raising and lowering pins 145 pass through the through holes 144 to project to above the upper surface of the heating plate 140 so as to support and raise and lower the wafer W.

Figure 8:
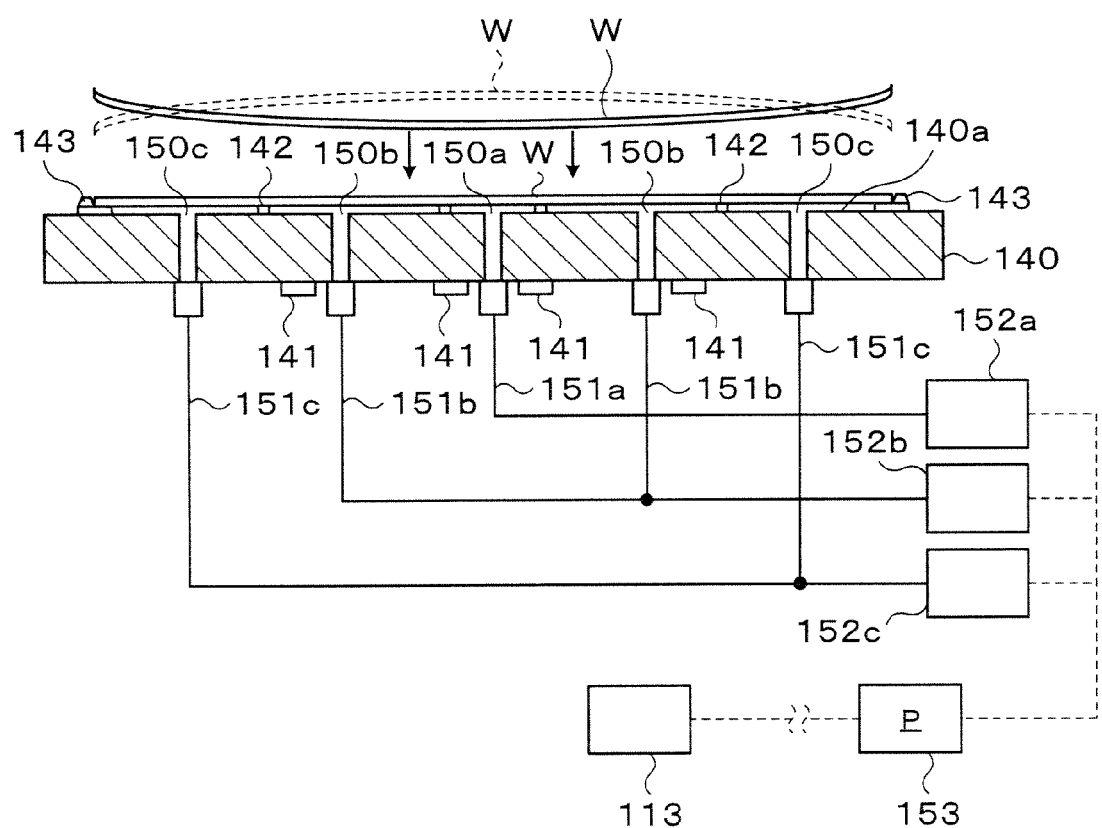
FIG. 8 is a longitudinal sectional view showing a configuration of a heating plate of the PEB unit.
Figure 9:
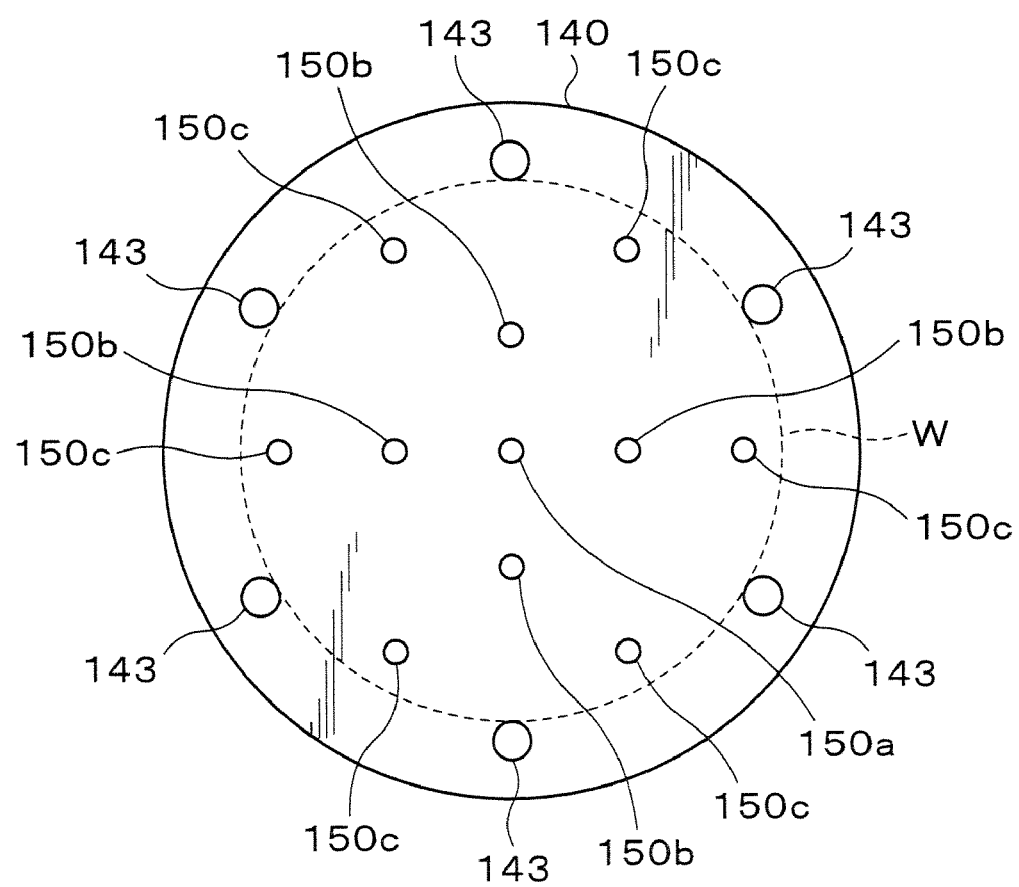
FIG. 9 is a plan view of the heating plate showing the arrangement of suction ports.

The heating plate 140 is formed with a plurality of suction ports 150*a*, 150*b*, and 150*c* vertically passing through the heating plate 140 for example, as shown in FIG. 8. The suction port 150*a* is formed at the central portion of the wafer mounting surface 140*a* of the heating plate 140, the suction port 150*c* is formed at the outer peripheral portion of the wafer mounting surface 140*a*, and the suction port 150*b* is formed at intermediate portion between the central portion and the outer peripheral portion of the wafer mounting surface 140*a*. A plurality of the suction ports 150*b* and suction ports 150*c* are formed as shown in FIG. 9, for example, such that they are formed at regular intervals on the respective same circles about the center of the heating plate 140 as a rotation center.

As shown in FIG. 8, to the lower ends of the suction ports 150*a*, 150*b* and 150*c*, separate suction pipes 151*a*, 151*b* and 151*c* are connected, respectively. The suction pipes 151*a*, 151*b* and 151*c* are connected to separate negative pressure generators 152*a*, 152*b* and 152*c*, respectively. The negative pressure generators 152*a*, 152*b* and 152*c* can suck the wafer W on the heating plate 140 to attract it to heating plate 140 the via the suction ports 150*a*, 150*b*, and 150*c*. Note that, in place of the negative pressure generators, open/close valves connected to vacuum lines may be provided along the suction pipes 151*a*, 151*b* and 151*c*.

The operations of the negative pressure generators 152*a*, 152*b* and 152*c* are controlled, for example, by the control unit 153. The control unit 153 can set a suction start timing, a suction end timing and a suction pressure for each of the suction ports 150*a*, 150*b*, and 150*c*, for example, based on the measurement result of the warped state inputted from the measurement control unit 113 of the warpage measuring unit 88. Based on the settings, the control unit 153 can then control the operations of the negative pressure generators 152*a*, 152*b* and 152*c* to control the suction via each of the suction ports 150*a*, 150*b*, and 150*c*. For example, for the warped shape of the wafer W protruding downward (shown by a solid line in FIG. 8), the suction start timings via the suction ports are set in the control unit 153 such that they are in an order of the suction ports 150*c*, the suction ports 150*b*, and the suction port 150*a*. Besides, for the warped shape of the wafer W protruding upward (shown by a dotted line in FIG. 8), the suction start timings via the suction ports are set such that they are in an order of the suction port 150*a*, the suction ports 150*b*, and the suction ports 150*c*.

It should be noted that the control unit 153 is, for example, a computer which has a program storage unit. The program storage unit stores a program P for executing a later-described predetermined heat-processing by setting the suction start timings via the suction ports 150*a*, 150*b*, and 150*c* based on the measurement result of the warped state from the above-described warpage measuring unit 88 and controlling the operations of the negative pressure generators 152*a*, 152*b* and 152c based on the settings. Note that the program P may be one recorded on a computer-readable recording medium and installed from the recording medium to the control unit 153.

The heating plate accommodating unit 131 has an annular holding member 160 for accommodating the heating plate 140 and holding the outer peripheral portion of the heating plate 140, and a support ring 161 almost in a cylindrical shape surrounding the outer periphery of the holding member 160, for example, as shown in FIG. 6.

In the cooling section 122 adjacent to the heating section 121, for example, a cooling plate 170 is provided which mounts and cools the wafer W thereon. The cooling plate 170 has, for example, a substantially square flat-plate shape as shown in FIG. 7 with its end face on the heating section 121 side curved in an arc shape. Inside the cooling plate 170, for example, a not-shown cooling member such as a Peltier element is embedded and can adjust the cooling plate 170 to a predetermined preset temperature.

The cooling plate 170 is supported on a support arm 171, and the support arm 171 is attached to a rail 172 extending in the X-direction toward the heating section 121 side, for example, as shown in FIG. 6. The cooling plate 170 can move on the rail 172 by means of a drive unit 173 attached to the support arm 171. This allows the cooling plate 170 to move a position above the heating plate 140 on the heating section 121 side.

The cooling plate 170 is formed with, for example, two slits 174 along the X-direction, for example, as shown in FIG. 7. The slits 174 are formed from the end surface on the heating section 121 side of the cooling plate 170 to the vicinity of the central portion of the cooling plate 170. The slits 174 prevent the cooling plate 170 which has moved to the heating section 121 side from interfering with the first raising and lowering pins 145 projecting to above the heating plate 140. As shown in FIG. 6, second raising and lowering pins 175 are provided below the cooling plate 170 located in the cooling section 122. The second raising and lowering pins 175 can be raised and lowered by a raising and lowering drive unit 176. The second raising and lowering pins 175 can rise from below the cooling plate 170, pass through the slits 174, and project to above the cooling plate 170 to support the wafer W.

As shown in FIG. 7, both side surfaces of the housing 120 across the cooling plate 170 are formed with transfer-in/out ports 180 for transferring-in/out the wafer W.

The other PEB units 85 to 87 have the same configuration as that of the above-described PEB unit 84, and therefore their description will be omitted.

Next, the heat-processing process performed in the PEB unit 84 configured as described above will be described in conjunction with the wafer processing process in the whole coating and developing treatment system 1.

First of all, unprocessed wafers W are taken out by the wafer transfer body 7 one by one from the cassette C on the cassette mounting table 5, and transferred to the temperature regulating unit 60 in the third processing unit group G3. The wafer W transferred to the temperature regulating unit 60 is temperature-regulated to a predetermined temperature, and is then transferred by the first transfer unit 10 to the bottom coating unit 23 where an anti-reflection film is formed. The wafer W having the anti-reflection film formed thereon is transferred by the first transfer unit 10 to the heating unit 92, the high-temperature heat processing unit 65, and the high-precision temperature regulating unit 70 in sequence so that predetermined processing is performed in each of the units. Thereafter, the wafer W is transferred to the resist coating unit 20.

After a resist film is formed on the wafer W in the resist coating unit 20, the wafer W is transferred by the first transfer unit 10 to the pre-baking unit 71, and then transferred by the second transfer unit 11 to the edge exposure unit 94 and the high-precision temperature regulating unit 83 in sequence so that the wafer W is subjected to predetermined processing in each of the units. The wafer W is then transferred, for example, to the warpage measuring unit 88.

The wafer W transferred into the warpage measuring unit 88 is supported on the support pins 110 as shown in FIG. 4, and the distance between each of the laser displacement gauges 112 and the wafer W is measured by the laser displacement gauge 112. The measurement information is outputted to the measurement control unit 113, so that the warped shape of the wafer W either protruding upward or protruding downward, and the warpage amount of the wafer W are measured. The measurement result is outputted to the control unit 153 of the PEB unit 84. In the control unit 153, the suction start timings via the suction ports 150a, 150b, and 150c in the PEB unit 84 are set, for example, based on the warped shape of the wafer W. For example, when the wafer W is in a shape protruding downward, the suction start timings are set such that they are in an order of the suction ports 150c, 150b, and 150a. Besides, when the wafer W is in a shape protruding upward, the suction start timings are set such that they are in an order of the suction port 150a, 150b, and 150c.

The wafer W for which measurement of the warped state in the warpage measuring unit 88 has been finished is transferred by the wafer transfer body 101 in the interface section 4 to the not-shown aligner where the wafer is exposed to light. The wafer W for which exposure processing has been finished is transferred by the wafer transfer body 101, for example, to the PEB unit 84.

The wafer W transferred to the PEB unit 84 is first mounted on the cooling plate 170. The cooling plate 170 is subsequently moved to a position above the heating plate 140. The first raising and lowering pins 145 are raised so that the wafer W on the cooling plate 170 is passed to the first raising and lowering pins 145. The cooling plate 170 then retracts from the position above the heating plate 140, and the raising and lowering pins 145 are lowered.

Figure 10:
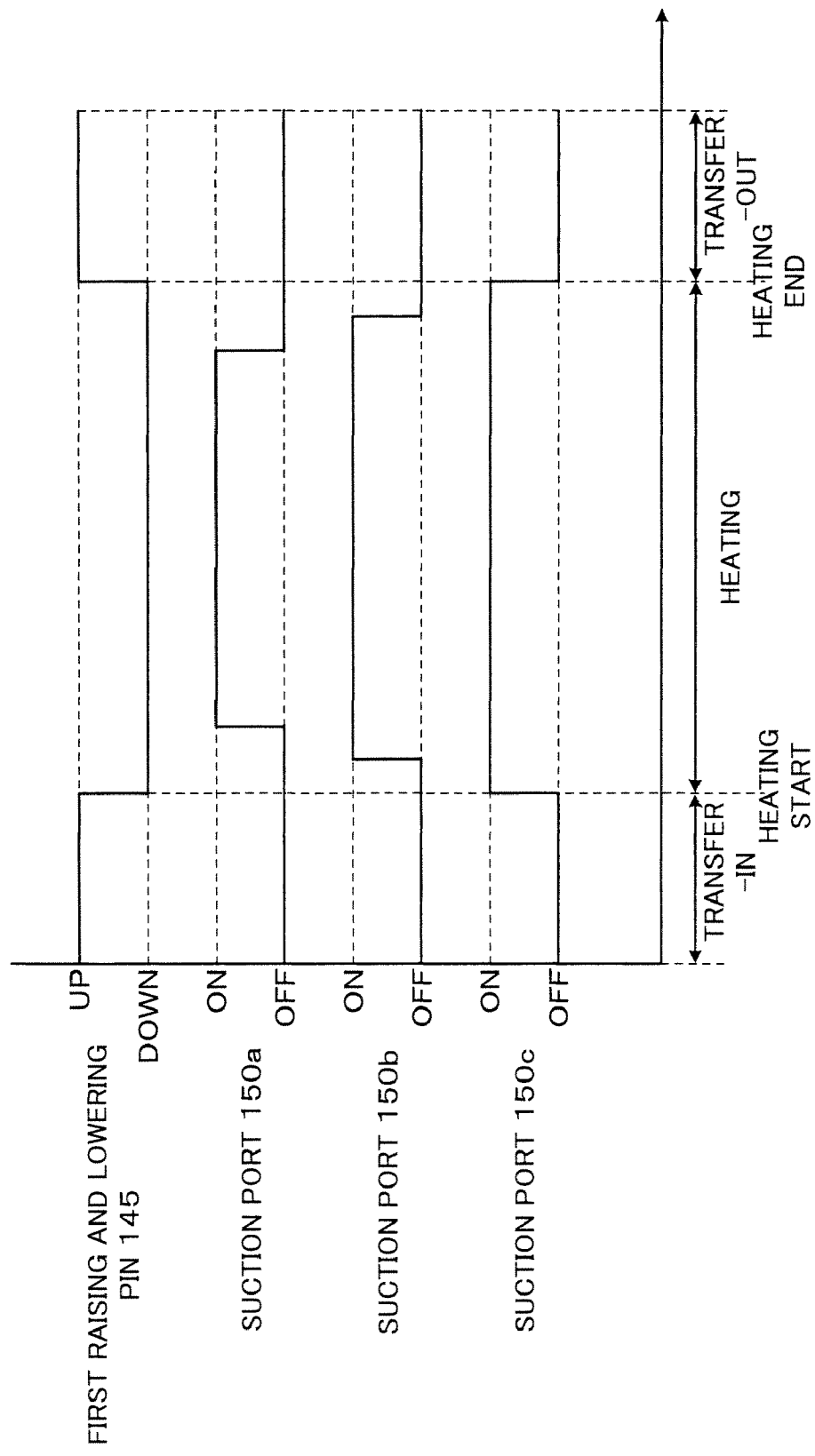
FIG. 10 is a graph showing operation timings of raising and lowering of first raising and lowering pins and suction via suction ports when the wafer warps protruding downward.
Figure 11A:
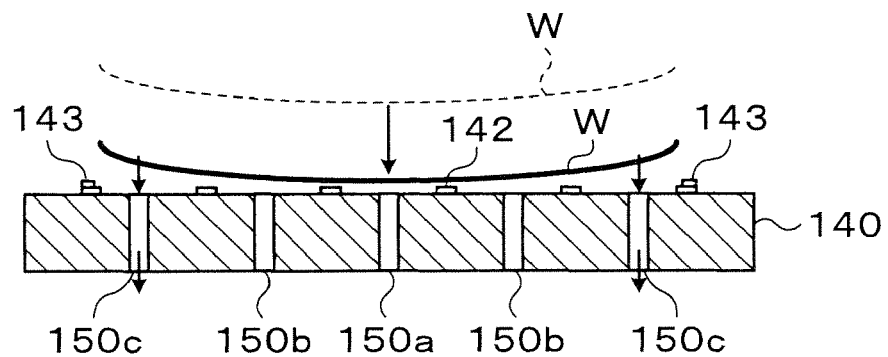
FIG. 11A is an explanatory view showing the state in which a peripheral portion of the wafer bending protruding downward is sucked via the suction ports.
Figure 11B:
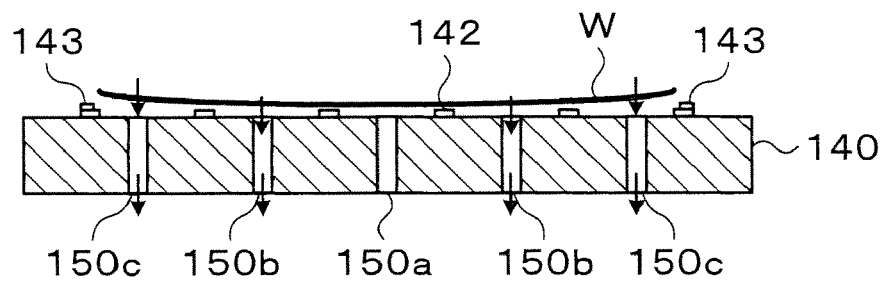
FIG. 11B is an explanatory view showing the state in which an intermediate portion of the wafer is sucked via the suction ports.
Figure 11C:
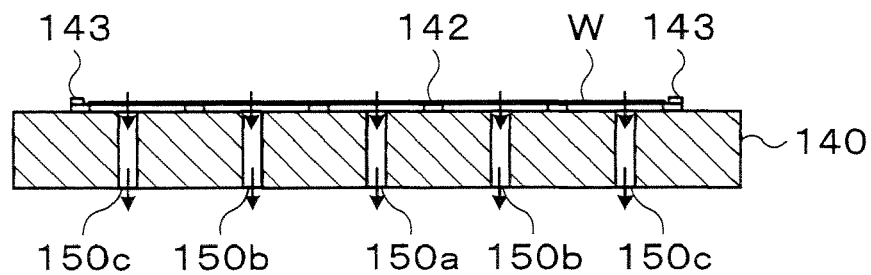
FIG. 11C is an explanatory view showing the state in which a central portion of the wafer is sucked via the suction port.

FIG. 10 is a graph showing operation timings of the first raising and lowering pins 145 and the suction ports 150a, 150b and 150c when the wafer W warps in a shape protruding downward. When the wafer W warps in a shape protruding downward, upon the first raising and lowering pins 145 having lowered, suction via the suction ports 150c corresponding to the outer peripheral portion of the wafer W is started. In this event, for example, as shown in FIG. 11A, the outer peripheral portion of the wafer W bending downward is sucked via the suction ports 150c so that the bending is started to be corrected. For example, immediately thereafter, suction via the suction ports 150b corresponding to the intermediate portion of the wafer W is then started. This causes the intermediate portion of the wafer W to be sucked via the suction ports 150b as shown in FIG. 11B, thereby further correcting the bending of the wafer W. For example, immediately thereafter, suction via the suction port 150a corresponding to the central portion of the wafer W is started. Thus, as shown in FIG. 11C, the entire surface of the wafer W is attracted by suction onto the heating plate 140 with the wafer W being corrected flat, and heating of the wafer W by the heating plate 140 is performed.

Figure 12:
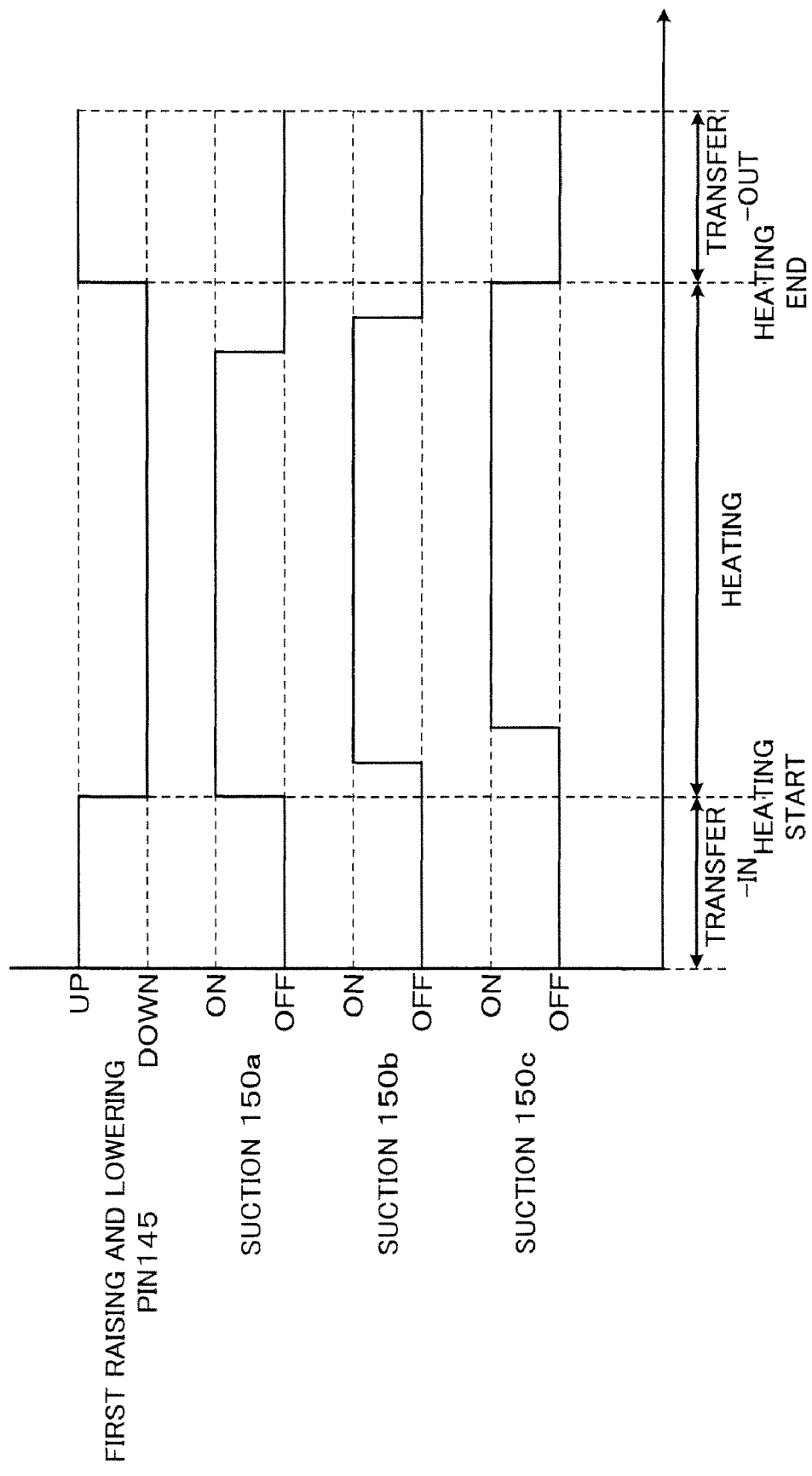
FIG. 12 is a graph showing operation timings of raising and lowering of the first raising and lowering pins and suction via the suction ports when the wafer warps protruding upward.
Figure 13A:
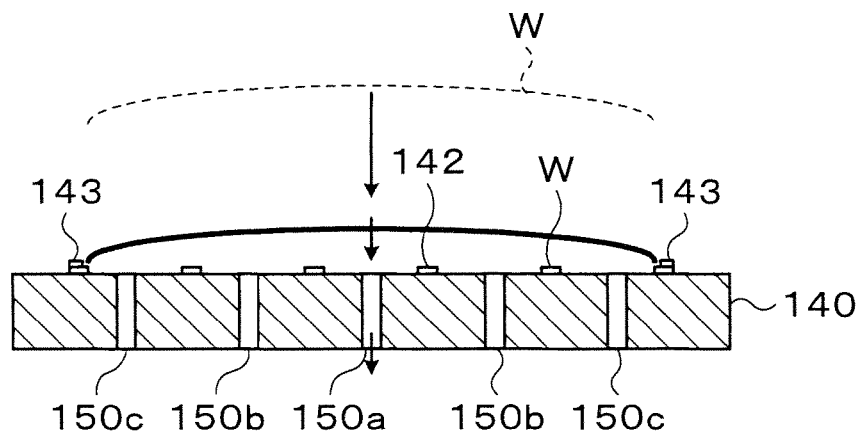
FIG. 13A is an explanatory view showing the state in which a central portion of the wafer bending protruding upward is sucked via the suction port.
Figure 13B:
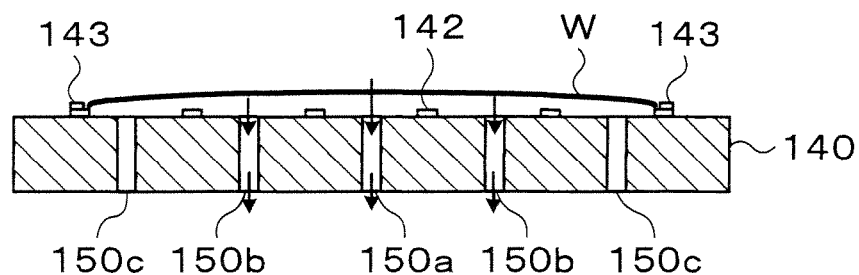
FIG. 13B is an explanatory view showing the state in which an intermediate portion of the wafer is sucked via the suction ports.
Figure 13C:
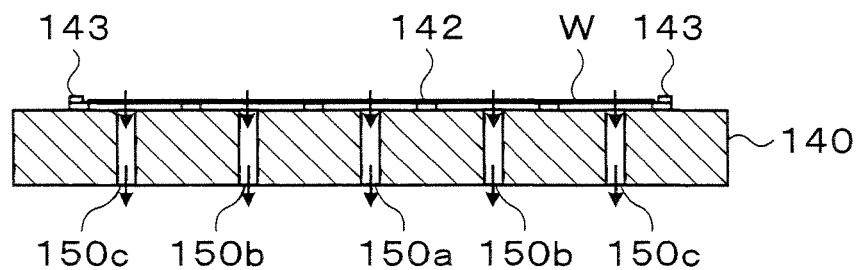
FIG. 13C is an explanatory view showing the state in which a peripheral portion of the wafer is sucked via the suction ports.

FIG. 12 is a graph showing operation timings of the first raising and lowering pins 145 and the suction ports 150a, 150b and 150c when the wafer W warps in a shape protruding upward. When the wafer W warps in a shape protruding upward, upon the first raising and lowering pins 145 having lowered, suction via the suction port 150*a* corresponding to the central portion of the wafer W is started. In this event, for example, as shown in FIG. 13A, the central portion of the wafer W bending upward is sucked via the suction port 150*a* so that the bending is started to be corrected. For example, immediately thereafter, suction via the suction ports 150*b* corresponding to the intermediate portion of the wafer W is then started. This causes the intermediate portion of the wafer W to be sucked via the suction ports 150*b* as shown in FIG. 13B, thereby further correcting the bending of the wafer W. For example, immediately thereafter, suction via the suction ports 150*c* corresponding to the outer peripheral portion of the wafer W is started. Thus, as shown in FIG. 13C, the entire surface of the wafer W is attracted by suction onto the heating plate 140 with the wafer W being corrected flat, and heating of the wafer W by the heating plate 140 is performed.

Thereafter, the wafer W is heated on the heating plate 140 for a predetermined time. For example, when the end of the heating approaches, the suction is stopped, for example, in an order of the suction ports 150*a*, 150*b* and 150*c*. For example, at the timing of stopping the suction via the last suction ports 150*c*, the first raising and lowering pins 145 are raised to raise the wafer W to above the heating plate 140, thereby completing the heating of the wafer W.

Subsequently, the cooling plate 170 is moved again to the position above the heating plate 140 so that the wafer W is passed from the first raising and lowering pins 145 to the cooling plate 170. The wafer W passed to the cooling plate 170 is cooled to room temperature, and then transferred out of the PEB unit 84, with which a series of heat processing ends.

After the heat processing in the PEB unit 84 is finished, the wafer W is then transferred by the second transfer unit 11 to the developing treatment unit 30 where the resist film on the wafer W is developed. The wafer W is then transferred by the second transfer unit 11 to the post-baking unit 75 where the wafer W is subjected to heat-processing, and is then transferred to the high-precision temperature regulating unit 63 where the wafer W is temperature-regulated. The wafer W is then transferred by the first transfer unit 10 to the transition unit 61 and returned to the cassette C by the wafer transfer body 7, thus completing a series of steps of the photolithography process.

According to the above embodiment, the warped state of the wafer W is measured in the warpage measuring unit 88 so that based on the warped state, the suction start timings via the suction ports 150*a*, 150*b* and 150*c* in the PEB unit 84 are set. The setting of the suction start timings is made such that when the wafer W warps in a curved shape protruding downward, suction is started in an order of the suction ports 150*c* at the outer peripheral portion of the wafer mounting surface 140*a*, the suction ports 150*b* at the intermediate portion, and the suction port 150*a* at the central portion. Besides, the setting is made such that when the wafer W warps in a curved shape protruding upward, suction is started in an order of the suction port 150*a* at the central portion of the wafer mounting surface 140*a*, the suction ports 150*b* at the intermediate portion, and the suction ports 150*c* at the outer peripheral portion. This allows suction to be started first for a portion of the wafer W deformed upward and apart from the heating plate 140, so that correction for that part is quickly performed. As a result of this, the whole wafer W is quickly flattened, so that the heating is uniformly performed within the wafer, resulting in increased uniformity in line width of the finally formed resist pattern.

Although, concurrently with the end of the heating, suction via all of the suction ports 150*a* to 150*c* may be finished at the same time, the suction end timings are shifted between the suction ports 150*a*, 150*b* and 150*c* in the above embodiment, so that the suction force to the wafer W can be decreased in a stepwise manner, thereby preventing the wafer W from bouncing on the heating plate 140 when the suction pressure no longer exits at all. It should be noted that the order of suction via the suction ports 150*a*, 150*b* and 150*c* is not limited to the order of the suction ports 150*a*, 150*b* and 150*c* as in the above embodiment, but may be another order. Besides, for the need to consider the bounce of the wafer W, the suction via the suction ports 150*a* to 150*c* may be ended in an order which prevents the bounce, based on the warped shape of the wafer obtained from the result of warpage measurement of the wafer W.

While the deformed shape of the wafer W is either the warped shape protruding downward or the warped shape protruding upward in the above embodiment, the present invention is also applicable to the case when the wafer W has deformed in another shape. Also in this case, the suction start timing via the suction port corresponding to a deformed portion of the wafer W protruding upward is set earlier than the suction start timings via the other suction ports. This deformed shape of the wafer W in this case may be measured, for example, by the warpage measuring unit 88.

In the above embodiment, the suction pressures via the suction ports 150*a*, 150*b* and 150*c* may be set based on the warped state of the wafer W. For example, when the warped state of the wafer W protruding downward is detected in the warpage measuring unit 88, the suction pressures via the suction port 150*c*, the suctions port 150*b* and the suction port 150*a* are set in an ascending order (suction port 150*c*>suction port 150*b*>suction port 150*a*) in the control unit 153. The concrete suction pressure values via the suction ports 150*c*, 150*b* and 150*a* are set, for example, according to the warpage amount of the wafer W. For example, a correlation such that the suction pressure increases with an increase in the amount of warpage is found, so that the suction pressure values are set based on that correlation. Then, when the wafer W is mounted on the heating plate 140 in the PEB unit 84, the wafer W on the outer peripheral portion side is sucked at a higher suction pressure than that on the central portion side.

Further, if the warped state of the wafer W protruding upward is detected in the warpage measuring unit 88, the suction pressures via the suction port 150*a*, the suctions port 150*b* and the suction port 150*c* are set in an ascending order (suction port 150*a*>suction port 150*b*>suction port 150*c*) in the control unit 153. Then, when the wafer W is mounted on the heating plate 140 in the PEB unit 84, the wafer W on the central portion side is sucked at a higher suction pressure than that on the outer peripheral portion side. According to this example, the suction pressure via the suction port corresponding to a portion of the wafer W bending upward and apart from the heating plate 140 is set relatively high, so that correction of the wafer W is performed quickly and with an appropriate force.

Note that the suction pressures via the suction ports 150*a*, 150*b* and 150*c* are only required to be changed at least at the suction start time in this example, and the suction pressures may be retuned to the same pressure, for example, after the wafer W is attracted by suction. While the deformed shape of the wafer W is either the warped shape protruding downward or the warped shape protruding upward in the this example, the present invention is also applicable to the case when the wafer W has deformed in another shape, in which case the suction pressure via the suction port corresponding to a deformed portion of the wafer W protruding upward is set higher than the suction pressures via the other suction ports.

Figure 14:
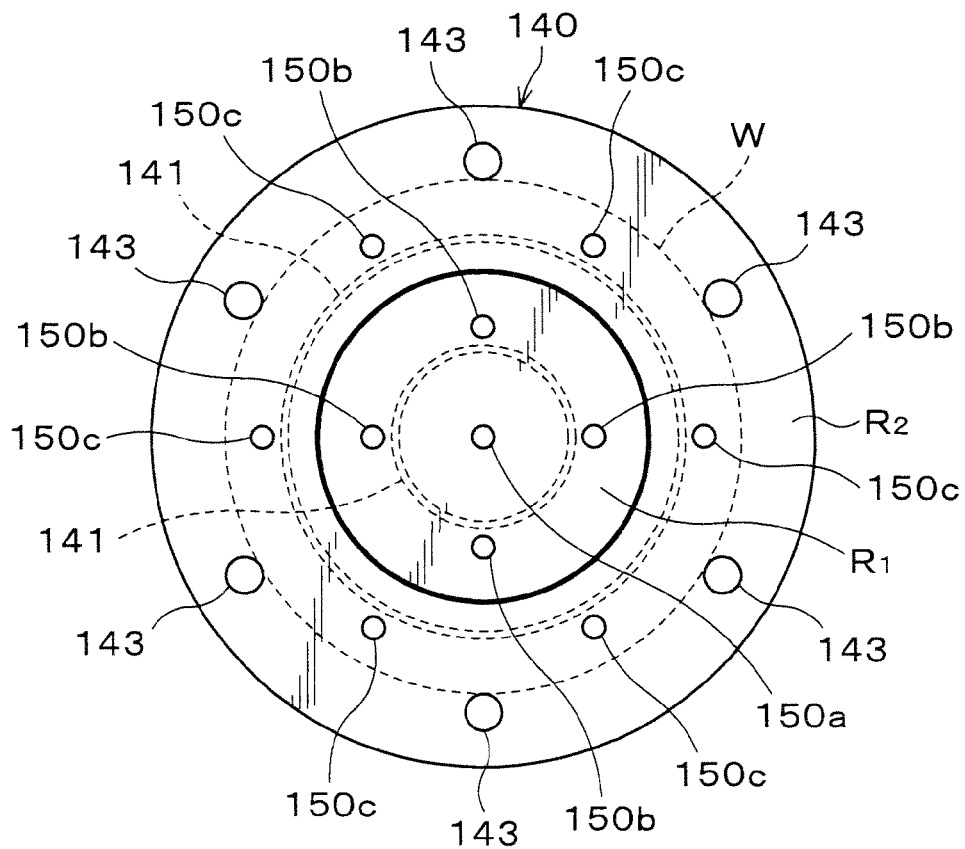
FIG. 14 is a plan view of the heating plate having two temperature regulating regions.

In the above embodiment, the heating plate 140 may be divided into a plurality of temperature regulating regions, so that the set temperature may be varied for each of the temperature regulating regions depending on the warped state of the wafer W. For example, as shown in FIG. 14, the heating plate 140 is divided into a plurality of, for example, two temperature regulating regions $R_1$ and $R_2$. The heating plate 140 is divided, for example, into a circular temperature regulating region $R_1$ located at the central portion as seen from plan view and a temperature regulating region $R_2$ annularly surrounding the periphery of the temperature regulating region $R_1$. To each of the temperature regulating regions $R_1$ and $R_2$, for example, an annular heater 141 is individually attached and can adjust the temperature to a predetermined temperature for each of the temperature regulating regions $R_1$ and $R_2$.

The control unit 153 can change the set temperature of each of the temperature regulating regions $R_1$ and $R_2$ based on the warpage measurement result from the warpage measuring unit 88. For example, if the wafer W warps protruding downward in the warpage measuring unit 88, the control unit 153 sets the set temperature of the temperature regulating region $R_2$ on the outer side corresponding to the portion of the wafer W bending upward than the set temperature of the temperature regulating region $R_1$ on the inner side. Conversely, if the wafer W warps protruding upward, the control unit 153 sets the set temperature of the temperature regulating region $R_1$ on the inner side corresponding to the portion of the wafer W bending upward than the set temperature of the temperature regulating region $R_2$ on the outer side.

In this example, the set temperature of the temperature regulating region corresponding to the portion of the wafer W bending upward is set relatively high. This ensures that when variations remain in the amount of accumulated heat within the wafer due to heating even if the correction of the wafer W is quickly performed, for example, by changing the suction start timings via the suction port 150a, 150b and 150c, the variations in the amount of accumulated heat can be corrected by temperature. As a result of this, the amount of accumulated heat of the wafer W can be finally made uniform within the wafer.

Note that while the deformed shape of the wafer W is either the shape protruding downward or the shape protruding upward in this example, the present invention is also applicable to the case when the wafer W has deformed in another shape, in which case the set temperature of the temperature regulating region corresponding to a portion of the wafer W deformed upward is set higher than the set temperatures of the other temperature regulating regions. Further, the heating plate 140 may be divided into temperature regulating regions in other shapes, and the number of division can be arbitrarily selected.

Figure 15:
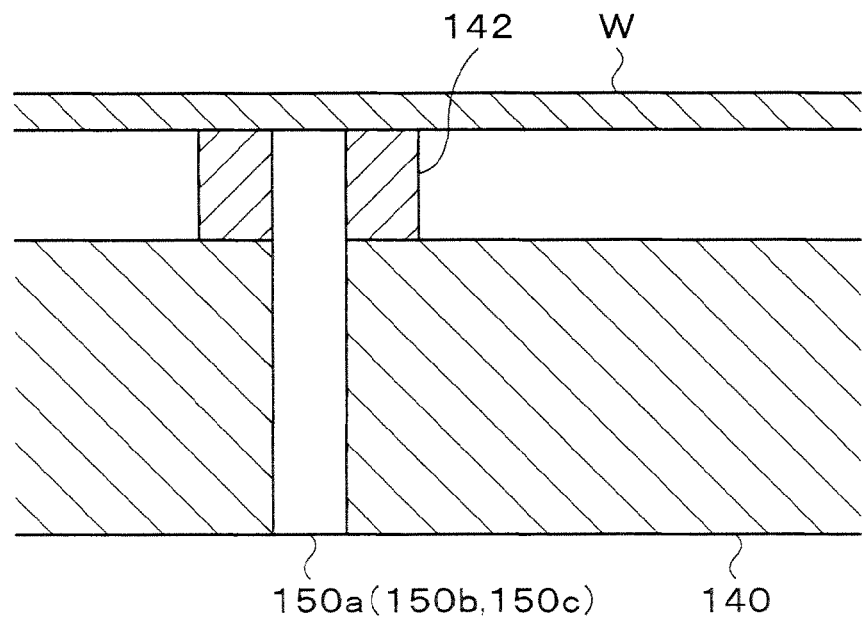
FIG. 15 is a longitudinal sectional view of the heating plate showing an example in which the suction port is are formed in a gap pin.

The suction ports 150a, 150b and 150c described in the above embodiment may be formed in the gap pins 142 on the heating plate 140 as shown in FIG. 15. In this case, the suction ports 150a, 150b and 150c open in the upper surfaces of the gap pins 142. According to this example, the suction ports 150a, 150b and 150c are formed at portions in direct contact with the wafer W, so that the correction of the wafer W can be performed more strongly and quickly.

A preferred embodiment of the present invention has been described above with reference to the accompanying drawings, but the present invention is not limited to the embodiments. It should be understood that various changes and modifications are readily apparent to those skilled in the art within the scope of the technical spirit as set forth in claims, and those should also be covered by the technical scope of the present invention.

Figure 16:
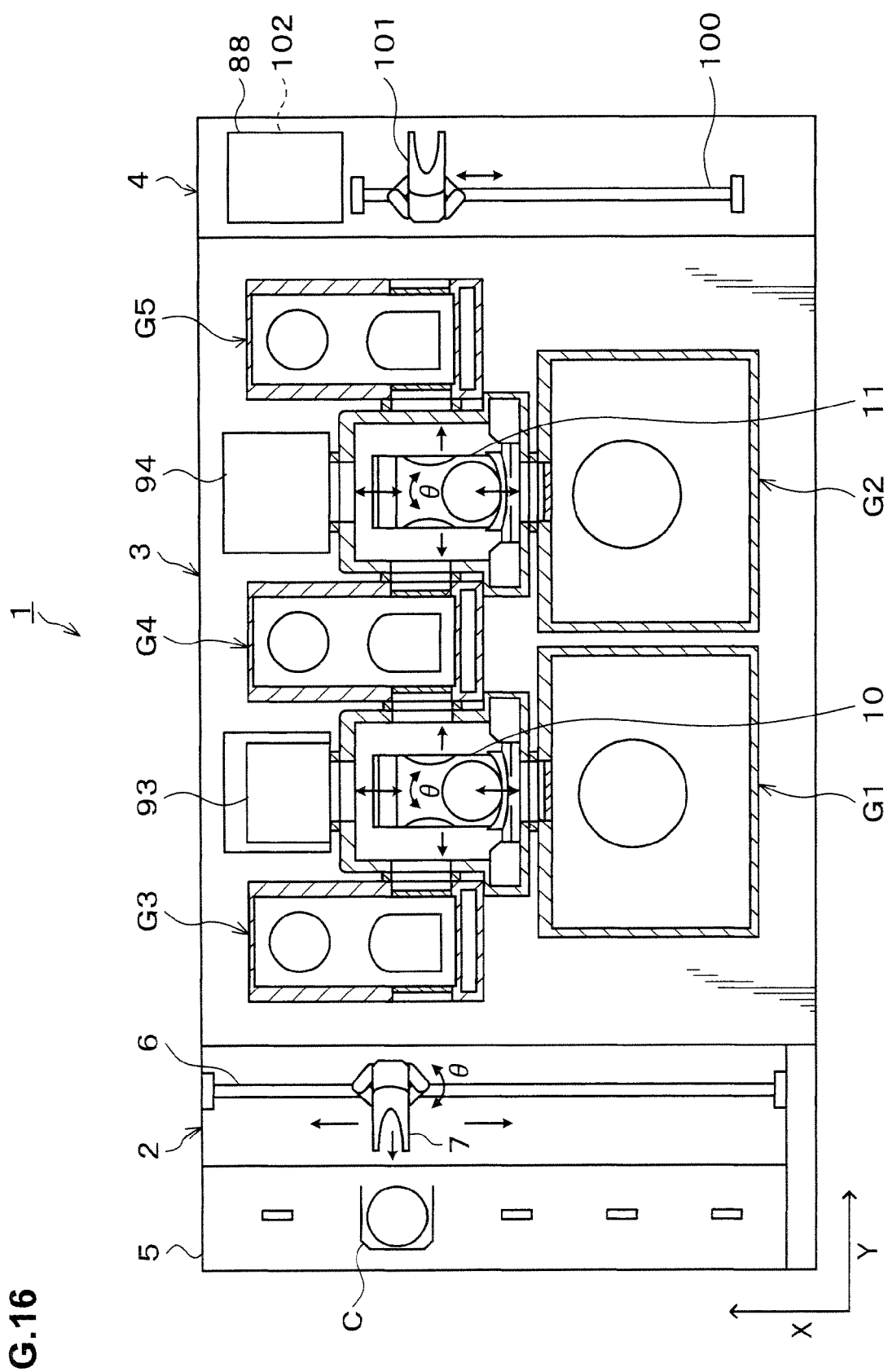
FIG. 16 is a plan view showing the configuration of the coating and developing treatment system in which the warpage measuring unit is provided in the interface section.

While the warpage measuring unit 88 is installed in the fifth processing unit group G5 in the above embodiment, it may be installed in another processing unit group or in the interface section 4 as shown in FIG. 16. Further, the timing to measure the warpage of the wafer W is not limited to the period between the pre-baking and the exposure processing, but may be another timing as necessary, such as before the resist coating treatment, between the resist coating treatment and the pre-baking, between the exposure processing and the PEB processing, or the like.

While the heat processing apparatus to which the present invention is applied is a PEB unit in the above embodiment, the present invention is also applicable to other heat processing units such as a pre-baking unit and a post-baking unit, and to a cooling processing unit including a cooling plate for mounting and cooling the wafer W thereon. Furthermore, the present invention is also applicable to heat processing apparatuses for substrates other than the wafer, such as an FPD (Flat Panel Display), a mask reticle for a photomask, and the like.

The present invention is useful in uniformly heat-processing a deformed substrate on a heat processing plate.

What is claimed is:

1. A heat processing method of mounting and heat-processing a substrate on a heat processing plate, comprising the steps of:
    measuring an amount of deformation of the substrate;
    setting suction start timings via a plurality of suction ports in a substrate mounting surface of the heat processing plate, based on the measured amount of deformation of the substrate to be heat-processed;
    when mounting the substrate onto the heat processing plate, sucking the substrate via the suction ports based on the set suction start timings to attract the substrate onto the heat processing plate; and
    heat-processing the substrate on the heat processing plate; and
    setting suction end timings via the suction ports such that the suction end timing via at least one of the suction ports is different from the suction end timings via another suction port, wherein
    in said step of setting suction start timings, the suction start timing via a suction port corresponding to a portion of the substrate deformed upward is set to be earlier than the suction start timing via another suction port.

2. The heat processing method as set forth in claim 1, wherein when the substrate is in a warped shape protruding upward, the suction start timing via a suction port corresponding to a central portion of the substrate is set to be earlier than the suction start timing via a suction port corresponding to an outer peripheral portion of the substrate, and
    wherein when the substrate is in a warped shape protruding downward, the suction start timing via the suction port corresponding to the outer peripheral portion of the substrate is set to be earlier than the suction start timing via the suction port corresponding to the central portion of the substrate.

3. The heat processing method as set forth in claim 1, further comprising the step of:
    setting suction pressures via the suction ports at least at the suction start time based on the measured amount of deformation of the substrate.

4. The heat processing method as set forth in claim 3,
wherein the suction pressure via a suction port corresponding to a portion of the substrate deformed upward is set to be higher than the suction pressure via another suction port.

5. The heat processing method as set forth in claim 4,
wherein when the substrate is in a warped shape protruding upward, the suction pressure via a suction port corresponding to a central portion of the substrate is set to be higher than the suction pressure via a suction port corresponding to an outer peripheral portion of the substrate, and
wherein when the substrate is in a warped shape protruding downward, the suction pressure via the suction port corresponding to the outer peripheral portion of the substrate is set to be higher than the suction pressure via the suction port corresponding to the central portion of the substrate.

6. The heat processing method as set forth in claim 1, further comprising the step of:
setting set temperatures of a plurality of temperature regulating regions formed in the heat processing plate based on the measured amount of deformation of the substrate.

7. The heat processing method as set forth in claim 6,
wherein the set temperature of a temperature regulating region corresponding to a portion of the substrate deformed upward is set to be higher than the set temperature of another temperature regulating region.

8. The heat processing method as set forth in claim 7,
wherein when the substrate is in a warped shape protruding upward, the set temperature of a temperature regulating region corresponding to a central portion of the substrate is set to be higher than the set temperature of a temperature regulating region corresponding to an outer peripheral portion of the substrate, and
wherein when the substrate is in a warped shape protruding downward, the set temperature of the temperature regulating region corresponding to the outer peripheral portion of the substrate is set to be higher than the set temperature of the temperature regulating region corresponding to the central portion of the substrate.

9. A computer program product, comprising:
a computer-readable storage medium storing a program for causing a computer to execute control when implementing a heat processing method by mounting a substrate on a heat processing plate of a heat processing apparatus, said heat processing method including
measuring an amount of deformation of the substrate
setting suction start timings via a plurality of suction ports in a substrate mounting surface of the heat processing plate, based on the measured amount of deformation of the substrate to be heat-processed;
when mounting the substrate onto the heat processing plate, sucking the substrate via the suction ports based on the set suction start timings to attract the substrate onto the heat processing plate; and
heat-processing the substrate on the heat processing plate; and
setting suction end timings via the suction ports such that the suction end timing via at least one of the suction ports is different from the suction end timings via another suction port, wherein
in said step of setting suction start timings, the suction start timing via a suction port corresponding to a portion of the substrate deformed upward is set to be earlier than the suction start timing via another suction port.

10. A substrate heat processing apparatus, comprising:
a heat processing plate for mounting and heat-processing a substrate thereon;
a warpage measuring unit configured to measure an amount of deformation of the substrate;
a plurality of suction ports formed in a substrate mounting surface of said heat processing plate for sucking the substrate; and
a control unit configured to set suction start timings via said suction ports based on the measured amount of deformation of the substrate to be heat-processed such that the suction start timing via at least one of the suction ports is different from the suction start timing via another suction port and, when mounting the substrate on said heat processing plate, to allow the substrate to be sucked via said suction ports in sequence based on the set suction start timings to attract the substrate onto said heat processing plate,
wherein said control unit sets suction end timings via the suction ports such that the suction end timing via at least one of the suction ports is different from the suction end timings via another suction port.

11. The heat processing apparatus as set forth in claim 10,
wherein the suction start timing via a suction port corresponding to a portion of the substrate deformed upward is set to be earlier than the suction start timing via another suction port.

12. The heat processing apparatus as set forth in claim 11,
wherein when the substrate to be heat-processed is in a warped shape protruding upward, the suction start timing via a suction port corresponding to a central portion of the substrate is set to be earlier than the suction start timing via a suction port corresponding to an outer peripheral portion of the substrate, and
wherein when the substrate to be heat-processed is in a warped shape protruding downward, the suction start timing via the suction port corresponding to the outer peripheral portion of the substrate is set to be earlier than the suction start timing via the suction port corresponding to the central portion of the substrate.

13. The heat processing apparatus as set forth in claim 11,
wherein said control unit sets suction pressures via the suction ports at least at the suction start time based on the measured amount of deformation of the substrate to be heat-processed.

14. The heat processing apparatus as set forth in claim 13,
wherein the suction pressure via a suction port corresponding to a portion of the substrate deformed upward is set to be higher than the suction pressure via another suction port.

15. The heat processing apparatus as set forth in claim 14,
wherein when the substrate to be heat-processed is in a warped shape protruding upward, the suction pressure via a suction port corresponding to a central portion of the substrate is set to be higher than the suction pressure via a suction port corresponding to an outer peripheral portion of the substrate, and
wherein when the substrate to be heat-processed is in a warped shape protruding downward, the suction pressure via the suction port corresponding to the outer peripheral portion of the substrate is set to be higher than the suction pressure via the suction port corresponding to the central portion of the substrate.

16. The heat processing apparatus as set forth in claim 10,
wherein said control unit sets set temperatures of a plurality of temperature regulating regions formed in said heat processing plate based on the measured amount of deformation of the substrate to be heat-processed.

17. The heat processing apparatus as set forth in claim 16, wherein the set temperature of a temperature regulating region corresponding to a portion of the substrate deformed upward is set to be higher than the set temperature of another temperature regulating region.

18. The heat processing apparatus as set forth in claim 17, wherein when the substrate to be heat-processed is in a warped shape protruding upward, the set temperature of a temperature regulating region corresponding to a central portion of the substrate is set to be higher than the set temperature of a temperature regulating region corresponding to an outer peripheral portion of the substrate, and wherein when the substrate to be heat-processed is in a warped shape protruding downward, the set temperature of the temperature regulating region corresponding to the outer peripheral portion of the substrate is set to be higher than the set temperature of the temperature regulating region corresponding to the central portion of the substrate.

19. The heat processing apparatus as set forth in claim 16, wherein the set temperatures are set according to an amount of warpage of the substrate.

* * * * *